US009230620B1

(12) United States Patent
Lee

(10) Patent No.: US 9,230,620 B1
(45) Date of Patent: Jan. 5, 2016

(54) DISTRIBUTED HARDWARE TREE SEARCH METHODS AND APPARATUS FOR MEMORY DATA REPLACEMENT

(71) Applicant: Inphi Corporation, Santa Clara, CA (US)

(72) Inventor: Chien-Hsin Lee, Santa Clara, CA (US)

(73) Assignee: INPHI CORPORATION, Santa Clara, CA (US)

( * ) Notice: Subject to any disclaimer, the term of this patent is extended or adjusted under 35 U.S.C. 154(b) by 272 days.

(21) Appl. No.: 13/783,155

(22) Filed: Mar. 1, 2013

Related U.S. Application Data

(60) Provisional application No. 61/641,417, filed on May 2, 2012.

(51) Int. Cl.
*G06F 13/00* (2006.01)
*G11C 7/10* (2006.01)
*G06F 12/00* (2006.01)

(52) U.S. Cl.
CPC .................. *G11C 7/1072* (2013.01)

(58) Field of Classification Search
CPC ............... G11C 11/401; G11C 16/349; G11C 2029/4402; G11C 29/00; G11C 29/44; G11C 29/808; G06F 12/0246; G06F 17/30495; G06F 12/121
See application file for complete search history.

(56) References Cited

U.S. PATENT DOCUMENTS

| 5,146,571 | A | * | 9/1992 | Logan ........................... 714/6.13 |
| 5,781,717 | A | * | 7/1998 | Wu et al. ....................... 714/6.13 |
| 5,920,886 | A | * | 7/1999 | Feldmeier ....................... 711/108 |
| 2002/0124203 | A1 | * | 9/2002 | Fang ................................... 714/8 |
| 2003/0086434 | A1 | * | 5/2003 | Kloth ............................. 370/419 |
| 2004/0083336 | A1 | * | 4/2004 | Stark et al. ..................... 711/105 |
| 2005/0249080 | A1 | * | 11/2005 | Foote et al. ................... 369/59.1 |
| 2007/0234112 | A1 | * | 10/2007 | Thayer et al. ..................... 714/8 |
| 2008/0270703 | A1 | * | 10/2008 | Henrion et al. ............... 711/128 |
| 2010/0058144 | A1 | * | 3/2010 | Rohleder et al. .............. 714/763 |
| 2010/0192050 | A1 | * | 7/2010 | Burbridge et al. ............ 714/807 |
| 2010/0241789 | A1 | * | 9/2010 | Chu et al. ...................... 711/103 |

(Continued)

OTHER PUBLICATIONS

Kosaraju, S.R., "Efficient tree pattern matching," Foundations of Computer Science, 1989., 30th Annual Symposium on , vol., No., pp. 178,183, Oct. 30-Nov. 1, 1989 doi: 10.1109/SFCS.1989.63475.*

(Continued)

*Primary Examiner* — Aimee Li
*Assistant Examiner* — Alex Olson
(74) *Attorney, Agent, or Firm* — Richard T. Ogawa; Ogawa P.C.

(57) ABSTRACT

A memory interface for a plurality of DRAM devices comprising an input DRAM address matching module includes a local memory comprising a plurality of data entries, wherein the plurality of data entries comprising a plurality of DRAM addresses and a plurality of associated pointers, and wherein the plurality of associated pointers comprise output DRAM addresses, and a matching mechanism coupled to the local memory, wherein the matching mechanism is configured to receive the input DRAM address, wherein the matching mechanism is configured to determine whether the input DRAM address is specified in the plurality of data entries, and when the input DRAM address is specified in the plurality of data entries, the matching mechanism is configured to output an associated pointer associated with the input DRAM address.

14 Claims, 8 Drawing Sheets

(56) References Cited

U.S. PATENT DOCUMENTS

| | | | |
|---|---|---|---|
| 2010/0332894 A1* | 12/2010 | Bowers et al. | 714/8 |
| 2012/0023082 A1* | 1/2012 | Kotha et al. | 707/706 |
| 2012/0137079 A1* | 5/2012 | Ueda | 711/141 |
| 2012/0137168 A1* | 5/2012 | Lu | 714/6.13 |
| 2012/0254656 A1* | 10/2012 | Schock | 714/6.13 |
| 2013/0060996 A1* | 3/2013 | Berke | 711/105 |

OTHER PUBLICATIONS

Takanami, I.; Inoue, K.; Watanabe, T., "Reconfigurable fault tolerant binary tree-implementation in two-dimensional arrays and reliability analysis," Wafer Scale Integration, 1994. Proceedings., Sixth Annual IEEE International Conference on , vol., No., pp. 132,142, Jan. 19-21, 1994 doi: 10.1109/ICWSI.1994.291258.*

* cited by examiner

| Rank ID | Bank ID | Row Address | Column Address | Spare ID |
|---|---|---|---|---|
| 0 | 3 | 0x0A81 | 0x00C1 | 0 |
| 0 | 3 | 0x1BC1 | 0x01E0 | 1 |
| 1 | 0 | 0x0C03 | 0x032D | 1 |
| 1 | 1 | 0x0047 | 0x0004 | 0 |
| 1 | 1 | 0x0161 | 0x00CC | 0 |
| 1 | 2 | 0x1958 | 0x006E | 0 |
| 1 | 2 | 0x04DA | 0x01E9 | 1 |
| 1 | 3 | 0x098C | 0x000E | 1 |

FIGURE 2

DISTRIBUTED HARDWARE TREE SEARCH METHODS AND APPARATUS FOR MEMORY DATA REPLACEMENT

CROSS-REFERENCES TO RELATED APPLICATIONS

The present application is a non-provisional of and claims priority to U.S. Pat. App. No. 61/641,417, filed May 2, 2012. The present application is related to U.S. Pat. App. No. 61/607,164, filed Jun. 12, 2012. These applications are incorporated by reference for all purposes.

BACKGROUND OF THE DISCLOSURE

The present invention relates generally to solid state memory techniques. More particularly, the present invention provides methods and devices for repairing a "bad memory cell" with a substitute cell for a memory device such as a dynamic random access memory ("DRAM") device or others.

In memory systems, two general classes of memories exist. Such classes include low latency memories. The low latency memories have effectively infinite endurance or usage-cycles and do not degrade with respect to age or repeated accesses. Additionally, such classes also include relatively longer latency memories that do not have infinite endurance or usage cycles, and may degrade with respect to age or repeated accesses. In the case of the relatively long latency memories, sophisticated multi-error detection and correction algorithms have been implemented to correct for data cells that can degrade over the lifetime of the device due to aging effects or repeated accesses. In the case of low latency memories such as DRAM devices, however, effectively infinite endurance or usage-cycles are assumed so once weak bits or bad bits are mapped out by the device manufacturer, no errors should occur due to degradation of data cells due to aging effects or repeated accesses.

As is known, the conventional DRAM memory cell has an access transistor and a storage capacitor. The access transistor connects with the storage capacitor to a bitline when switched-on such that the capacitor stores the logic value placed on the bitline. Due to the tendency of a capacitor to lose its charge over time, DRAM memory cells must be periodically 'refreshed', which serves to maintain the value stored in each storage capacitor at its desired value. The amount of time that a cell can retain its logic value is referred to as its "data retention time".

A trend in the development of memory cells is that the cells have been shrinking due to advancements in process technology and the demand for ever larger memory capacity. This necessarily results in a reduction in the sizes of the access transistor and storage capacitor, which can lead to several limitations. For example, each access transistor exhibits leakage which acts to slowly drain stored charge from the storage capacitor. This leakage characteristic—and thus each cell's data retention time—varies from transistor to transistor; however, this variability increases as the size of the access transistors is reduced. Another problem is that a shrinking memory cell results in a smaller storage capacitor, and thus a reduced storage capacitance. This can also adversely affect the data retention time characteristics of the cells.

BRIEF SUMMARY OF THE INVENTION

The present invention is related to memory devices for electronic applications. More specifically, embodiments of the present invention provide a memory interface device comprising an address match table and methods of operation, which can be implemented various computing devices, servers, and the like. Merely by way of example, these devices can be configured for or implemented as memory devices, such as SDRAM, DDR SDRAM, RDRAM, SRAM, and Flash devices, and the like. But it will be recognized that the invention as a much broader range of applicability.

Embodiments of the present invention are directed to a random "bad cell" repair methods and apparatus. More specifically, embodiments of the present invention includes hardware and techniques to facilitate identification of "bad cells" from a data structure storing previously-identified "bad cells" (faulty memory storage cells) and determination of appropriate replacement cells (spare memory location).

In various embodiments, an address match table is provided with data entries specifying address of previously identified bad cells along with addresses of associated replacement cells. Incoming addresses of cells are compared within the address match table, and if there is an address match, the address match table outputs the address of the associated replacement cell. This output address is then used for addressing an external memory.

In various embodiments, because an address match table may include thousands of entries (e.g. N entries), it may be impractical to compare an incoming address with all of the entries in the table for various reasons. In one example, a content addressable memory (CAM) may be used, however, CAMs having thousands of entries typically require significant circuitry and operating power. In another example, a single comparator may be used, however, performing N comparisons for each incoming address would be too time consuming.

In some embodiments, a distributed hardware tree search is performed on incoming addresses. In such embodiments, the entries in the address match table may be sorted or pre-sorted into a balanced binary search tree data structure. In one example, the bad cell addresses are stored in nodes of the binary search tree binary tree of depth N. In such cases, at most, the number of comparisons cycles required for an incoming address will be N. The inventors of the present invention believe the number of comparisons may be further reduced.

In some embodiments, to decrease the number of comparisons required, the distributed hardware tree is modified to reduce the tree depth. In various embodiments, the upper layers of the binary search tree are flattened for searching purposes. Accordingly, comparisons within upper layers 1 through M are performed substantially in parallel, in a single comparison cycle. The remaining layers M+1 to N of the original binary search tree are then used as a truncated binary search tree. In operation, at most, the number of comparison cycles required to determine whether an incoming address is within upper layers 1 through M, and within the truncated binary search tree will be 1+N-M comparison cycles. N-M+1 is less than N (the maximum number of comparison cycles in a balanced binary search tree. In some embodiments, layers of the binary search tree may be divided into "even" and "odd" memories for further latency reduction.

Various additional objects, features and advantages of the present invention can be more fully appreciated with reference to the detailed description and accompanying drawings that follow.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which:

FIG. 2 illustrates a simplified Address Match Table according to an embodiment of the present invention.

DETAILED DESCRIPTION OF SPECIFIC EMBODIMENTS OF THE DISCLOSURE

A trend in the development of memory storage devices is that as the storage cells continue to shrink due to advancements in process technology, storage cells in low latency memories such as DRAM devices may become more susceptible to errors that occur due to aging effects or repeated accesses. Moreover, the number of weak bits due to natural process variations will continue to increase. Accordingly, it is desirable that spare storage cells can be utilized to correct for the presence of faulty storage cells in low latency memory that may develop over the lifetime of the device.

The present invention is related to memory devices for electronic applications. More specifically, embodiments of the present invention provide memory interface devices and memory IC (integrated circuit) devices, which can be implemented various computing devices, servers, and the like. Merely by way of example, these devices can be configured for or implemented as memory devices, such as SDRAM, DDR SDRAM, RDRAM, SRAM, and Flash devices, and the like. But it will be recognized that the invention as a much broader range of applicability.

A system and method are provided for replacing faulty or weak memory storage cells in a memory system through the use of an enhanced memory interface circuit or enhanced memory controller device and the use of redundant memory storage cells.

The present invention provides for a method that may be implemented in different ways for different systems. An implementation is described herein as an illustrative example. The example should not be construed as limiting the scope of the claims according to the present invention.

In an example, the present techniques provide for support of weak cell management in DRAM devices. It is believed that as DRAM process technology continue to advance, DRAM cell storage capacitance will continue to decrease and more and more DRAM storage cells will be unable to meet specified data retention time requirements. Furthermore, as the number of weak DRAM storage cell increases, DRAM devices as a whole will be unable to provide sufficient number of redundant rows and redundant columns to continue to effect repairs and present the façade of perfect storage devices. According to the present example, the techniques provide logic devices coupled with DRAM memory cells to help healing ailing DRAM devices and mitigate the ill effects of the weak DRAM cells. Further details of the present system and method can be found throughout the present specification and more particularly below.

EXAMPLE

Figure 1:
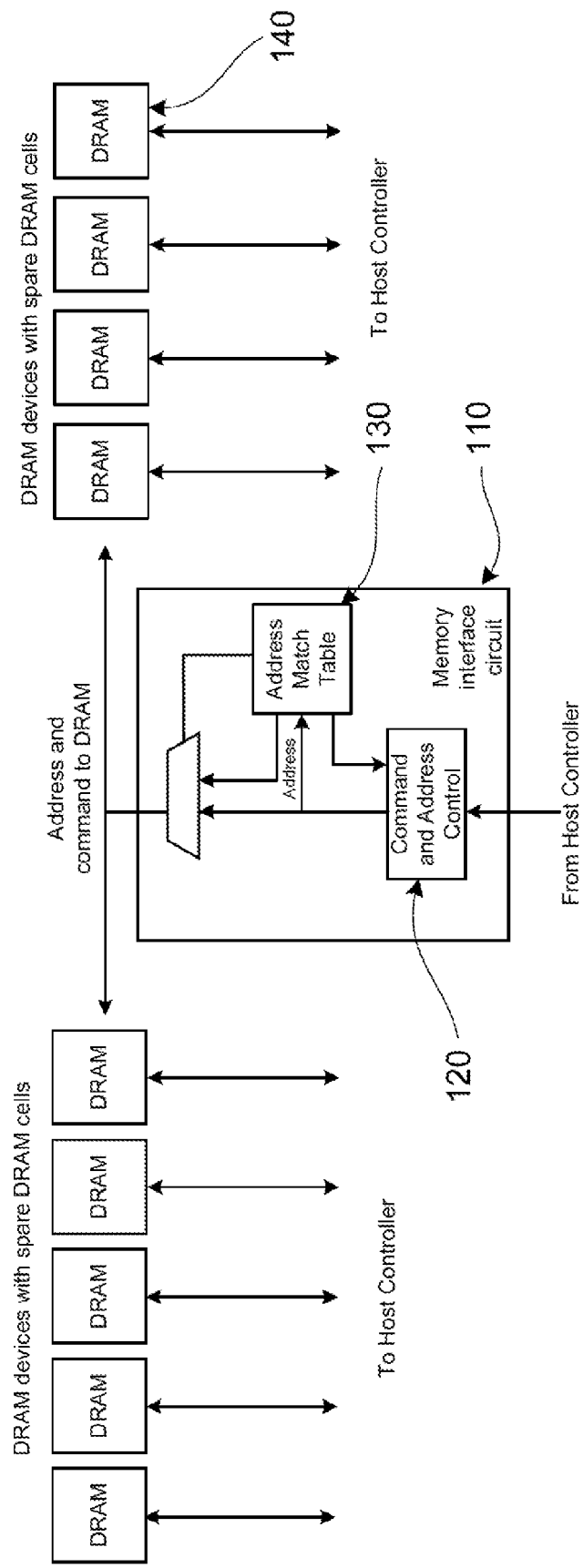
FIG. 1 illustrates a simplified block diagram of an interface circuit according to an embodiment of the present invention.

Utilizing an Address Match Table in Memory Interface Circuit, Controlling Spare Memory Storage Cells to Dynamically Replace Faulty Storage Cells in Memory Devices, as Illustrated by FIG. 1

FIG. 1 shows an example of use of an enhanced interface circuit that, in combination with spare cells in DRAM devices, can function to replace faulty memory locations in the DRAM devices. In FIG. 1, an enhanced memory interface circuit, labeled as 110 is shown to contain a command and address control unit, labeled as 120, and an Address Match Table, labeled as 130. The enhanced memory interface circuit re-drives addresses and commands from the host controller to the DRAM devices, one of which is labeled as 140 in FIG. 1. The DRAM devices contain spare DRAM cells, the addresses of which the enhanced memory interface circuit can select and effect the replacement of faulty or weak storage cell locations, as illustrated by the Table in FIG. 2.

As an example, the DRAM device may include a plurality of memory cell arrays, a plurality of switch blocks, and a plurality of sensing amplifying units. Each of the memory cell arrays includes at least one memory cell, and each memory cell may be connected to a word line and a bit line. Of course, other features exist with the DRAM device.

FIG. 2 shows an example of the Address Match Table, labeled as 130 in FIG. 1. FIG. 2 shows that the Address Match Table contains addresses of faulty memory storage cells. In the case of FIG. 2, the addresses are listed in terms of DRAM address formats: Rank ID, Bank ID, Row Address and Column Address. The reference spare ID can be "0" or "1," although there can be variations. The spare ID may be used to indicate data bus offset as to select subset(s) of DRAM devices to respond to the selection of a spare location. For example, the offset ID may indicate, for example, that: only the left side of the memory module should be matched against the bad memory address, only the right side of the memory module should be matched against the bad memory address, the entire width (one rank) of the memory module should be matched against the bad memory address, or a single DRAM device should be matched against the bad memory address.

In other implementations, address fields for Chip ID (CID) and Bank Group ID may also be used. The addresses of faulty or weak memory storage cells contained in the Address Match Table may be determined by testing during manufacturing or special run-time testing. The entries in the Address Match Table may also be dynamically updated during runtime if it is determined that additional memory storage locations are weak or faulty. The function of the Address Match Table is to act as a filter of addresses and commands that flow through the enhanced memory interface circuit 110. In the case that a given memory access is matched to an entry in the Address Match Table, the Address Match Table replaces the address of the memory access with the address of a spare memory location. In this manner, the existence of the faulty or weak memory address is hidden from the host memory controller, and the enhanced memory interface circuit enables the memory devices to present a contiguous memory address space without faulty or weak cell locations, as shown in FIG. 3.

Figure 3:
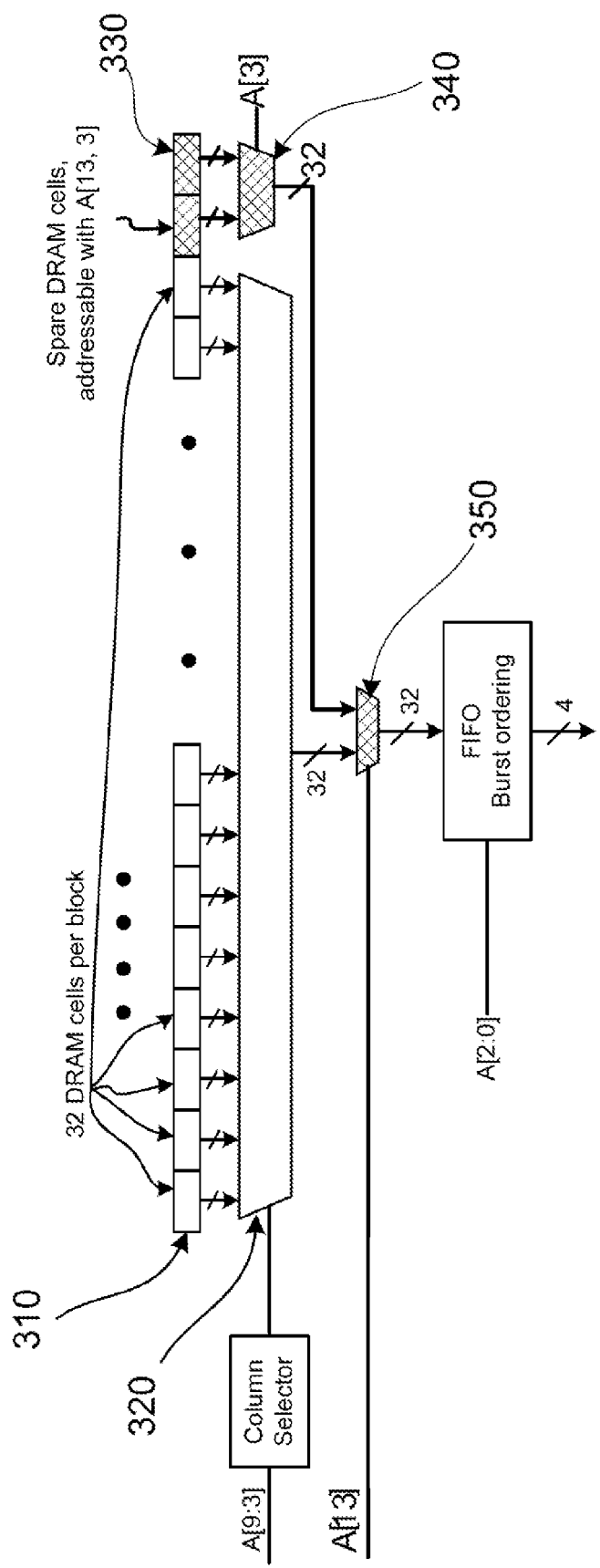
FIG. 3 illustrates a simplified diagram of spare memory cells in a DRAM device according to an embodiment of the present invention.

FIG. 3 shows an exemplary implementation of spare memory cells in a DRAM device. The spare memory storage cells are arranged in terms of added columns for each row. FIG. 3 shows a row of DRAM storage cell organized as blocks, with 32 DRAM cells per block. A block of 32 DRAM storage cells is labeled as 310 in FIG. 3. FIG. 3 also shows that in the exemplary DRAM device, column addresses A [9:3] are used to select between different blocks of DRAM storage cells through a block of circuits collectively labeled as a large multiplexor. The large multiplexor is labeled as 320 in FIG. 3. FIG. 3 also shows the implementation of two blocks of spare DRAM cells, labeled as 330. FIG. 3 further illustrates that the two blocks of spare DRAM cells can be separately selected through the use of the column address A[3] through a multiplexor circuit labeled as 340. Finally, the column address A[13] can be used to select between data from the baseline memory array or data from the spare memory cells through the multiplexor labeled as 350 in FIG. 3.

To prove the principle and operation of the present techniques, examples have been prepared. These examples are merely for illustration purposes and should not unduly limit the scope of the claims herein. One of ordinary skill in the art would recognize many variations, alternatives, and modifications.

To assist the reader, the following terms are defined as examples.
AMT: Address Match Table
CID: Chip ID
IFR: In-Field Repair
LRDIMM: Load-Reduced Dual Inline Memory Module
MB: Memory Buffer
MemBIST: Software tool to generate built in self test blocks for a memory matrix as a
VHDL model for the whole memory system.
RCD: Registering Clock Driver, Also known more simply as the "Register"
RDIMM: Registered Dual Inline Memory Module
RID: Rank ID
SPD: Serial Presence Detect
VRT: Variable Retention Time
WBA: Weak Bit Address
WBAL: Weak Bit Address List
WCM: Weak Cell Management In an example, techniques include a method that is provided within a framework wherein DRAM devices are characterized, weak cells within the DRAM devices are detected, their address locations stored in non-volatile memory locations, and the subsequent usage of the Weak Bit Address list to effect dynamic repairs that are transparent to the host memory controller. The section on MemBIST will provide descriptions of testing algorithms to detect weak cells, and the section on Weak Bit Address List storage format will specify their storage format in non-volatile memory, and the sections that describe specific repair concepts will detail the usage of the Weak Bit Address List to effect weak cell management.

In an example, the present description provides a high level architectural specification that is independent of specific DRAM types, specific DIMM types, and specific weak bit replacement concepts. It is intended that this specification will act as the master specification from which an implementation-specific architectural specification may be quickly derived.

In an example, the Externally-Addressable-Spare-Columns-in-DRAM concept is designed for implementation on a DDR3 or DDR4 Register DIMM (RDIMM) or LRDIMM. The Externally-Addressable-Spare-Columns-in-DRAM concept also utilizes a known Weak Bit Address List (WBAL) stored in one or more Address Match Tables (AMT) to compare against addresses of DRAM commands that flow through the Address and Command Path of the RDIMM or LRDIMM. In the case that a match to a known Weak Bit Address, the Address Match Table replaces the column-address of the Column-Access command with a column-address to a set of spare columns in the DRAM devices. The spare-columns are used to provide reliable storage locations for data in place of columns with known faulty or weak DRAM storage cells.

Figure 4:
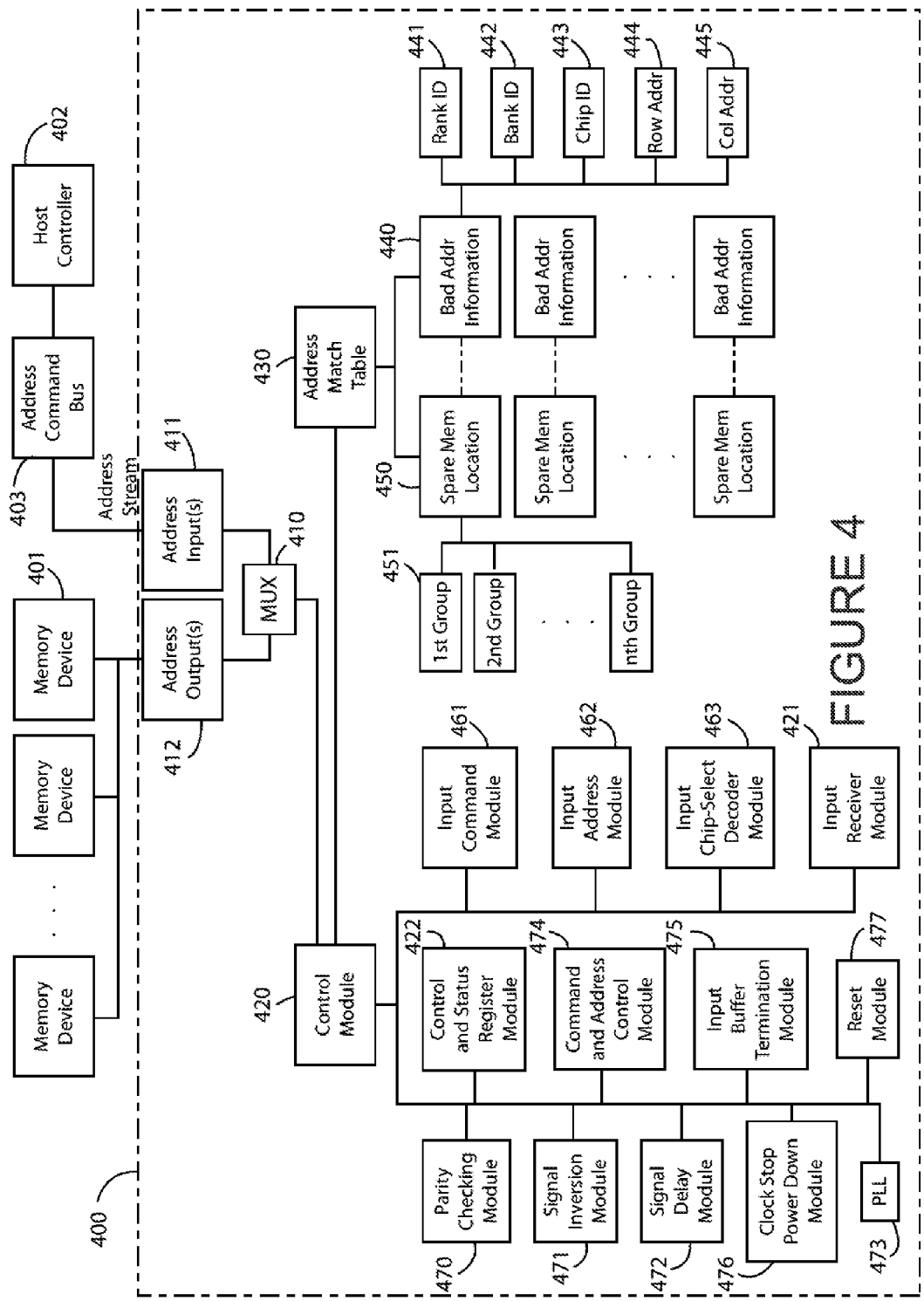
FIG. 4 illustrates a simplified block diagram of a memory interface device according to an embodiment of the present invention.

In an example, FIG. 4 illustrates a DDR4 Registered DIMM where the DDR4 Register has been modified to incorporate one or more Address Match Tables. The Address Match Tables check addresses of DRAM commands as the DRAM commands flow through the DDR4 Register against known Weak Bit Address locations. In the case of an address match, the DDR4 Register dynamically replaces the column-address of the column-access command with the address of a spare column in DRAM devices.

To facilitate the implementation of the Spare-Columns-in-DRAM concept the architectural description of the Address Match Table and Externally-Addressable-Spare-Columns-in-DRAM may be found in the following sections (1) Address Match Table; (2) Externally-Addressable-Spare-Columns-in-DRAM.

In an embodiment, the present invention provides a memory interface device. As shown in FIG. 4, the device 400 can include address input(s) 411, address output(s) 412, an address match table 420, a control module 430, and a multiplexer 410. In a specific embodiment, the memory interface device 400 can be selected from a register device, a buffer device, an advanced memory buffer, a buffer on-board, or the like and combinations thereof The address input(s) 411 can be configured to receive address information from an address stream of a host controller, while the address output(s) 412 can be coupled to a plurality of memory devices and be configured to drive address information. In a specific embodiment, the plurality of memory devices 401 can include a plurality of DRAM devices, Flash devices, or other like memory devices. Furthermore, the multiplexer 410 can be coupled to the address input and the address output.

The address match table 430 can include an array of SRAM cells, or the like. In a specific embodiment, this address match table 430 can include a plurality of bad address information 440 and a plurality of spare memory locations 450. Each of the plurality of bad address information 440 can be associated with one of the plurality of spare memory locations 450. Each of the plurality of bad address information can include a rank ID 441, a bank ID 442, a chip ID 443, a row address 444, and a column address 445. Additional parameters can also be included. Each of the plurality of spare memory locations can include a plurality of memory groups 451, which can include a first column, second column, and an nth column. Row and bank configurations can also be used, as various numbers and configurations of spare memory locations can be used depending on design and related applications. The address match table can be configured to receive bad address information and can be configured to transfer the spare memory location to replace the bad address associated with the bad address information.

The control module 420 can be a command and address module, or the like. This control module 420 can be integrated with the address match table. In a specific embodiment, this control module 420 can be configured to determine address information from an address stream from an address command bus 403 coupled to a host controller 402 during a run time operation. This control module 420 can be configured to compare each address from the address steam and configured to determine whether each address matches with a stored address in the address match table 430 to identify a bad address. The control module 420 can also be configured to replace the bad address with the revised address of the spare memory location 450.

In a specific embodiment, the control module 420 can include an input receiver module 421 or a control and status register module 422. The control module can also include an input command 461, an input address 462, and an input chip-select decoder module 463. Other components, such as a parity checking module 470, a signal inversion module 471, a signal delay module 472, a PLL (Phase-locked loop) 473, a command and address control module 474, an input buffer termination module 475, a clock stop power down module 476, a reset module 477, and the like, can also be included with the memory interface device 400.

In a specific embodiment, the memory interface device can be coupled to a plurality of DRAM devices. Each of these DRAM devices can include a plurality of address inputs, a plurality of control inputs, and a plurality of data input/outputs, a plurality of memory arrays, and a spare group. Each of the plurality of memory arrays can include a plurality of memory cells, each of which can be coupled to a data input/output. The spare group can include a plurality of spare memory cells. Each of these spare memory cells can be externally addressable using the address match table. Furthermore, the spare group can include a spare row, a spare column, or a spare bank.

Figure 5:
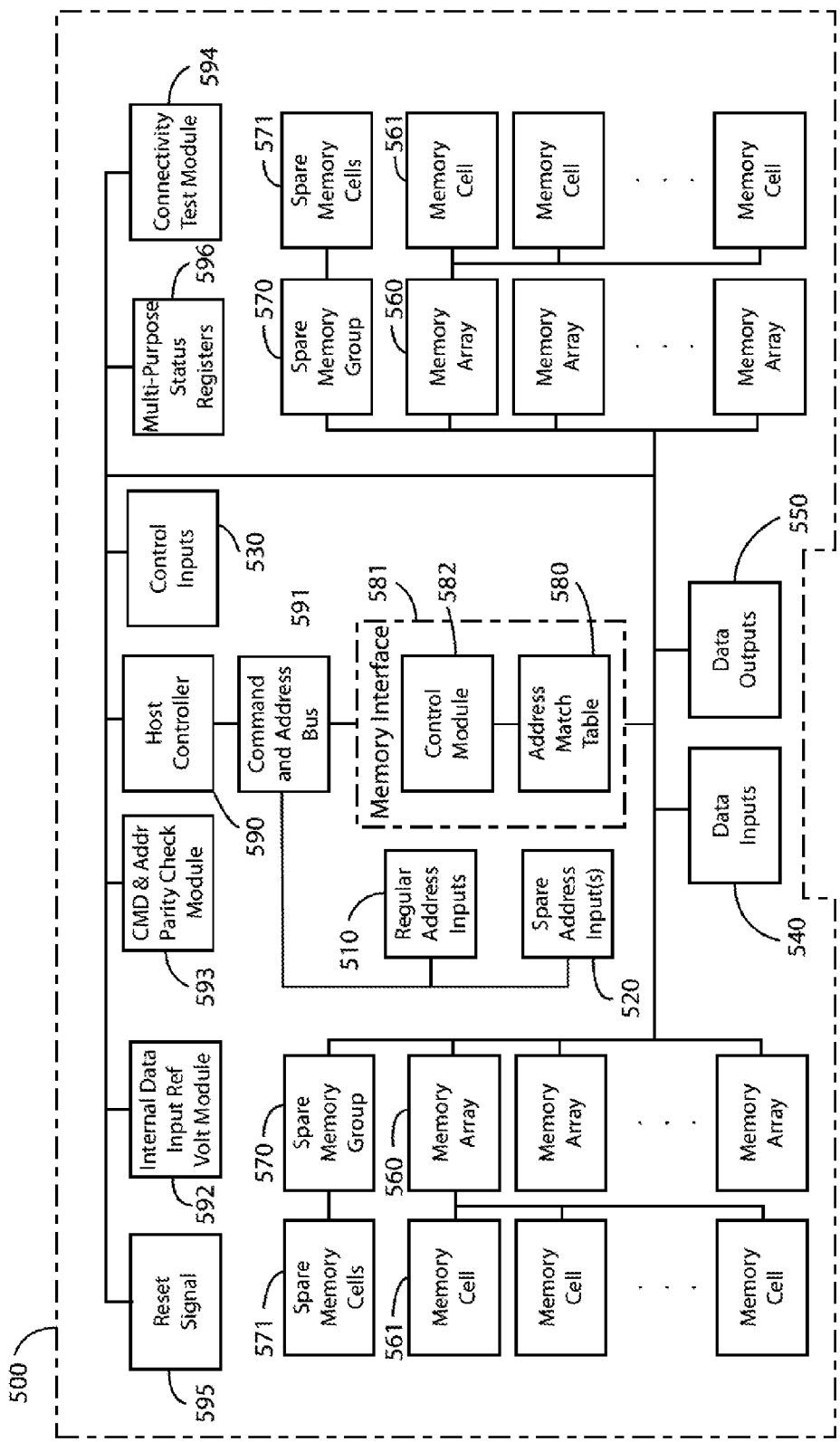
FIG. 5 illustrates a simplified block diagram of a memory integrated circuit device according to an embodiment of the present invention.

FIG. 5 illustrates a simplified block diagram of a memory integrated circuit device according to an embodiment of the present invention. As shown, this device 500 can include a plurality of regular address inputs 510, at least one spare address 520 configured for a selected mode or an unselected mode, a plurality of control inputs 530, a plurality of data inputs 540, a plurality of data outputs 550, a plurality of memory arrays 560, and a spare group of memory cells 570.

In a specific embodiment, each of the plurality of memory arrays 560 can include a plurality of memory cells 561. Each of these memory cells can be coupled to a data input/output 540/550. Also, the spare group of memory cells 570 can include a plurality of spare memory cells 571. The spare group of memory cells 571 can include a spare column, a spare row, a spare bank, or the like. Each of these memory cells 571 can be externally addressable using an address match table 580 and can be configured with the spare address input 520. The spare address input 520 can be coupled to the address match table 580 to access the spare memory cells 571. The address match table 580 can be provided within a memory interface device 581 with a control module 582. This memory interface 581 can be similar to that described for FIG. 4 above. In a specific embodiment, the spare address input 520 can include one of three unused column address inputs A11, A13, and A17.

In a specific embodiment, the plurality of spare memory cells 571 can be accessed from the group of memory cells 570 using the spare address input 520 during the selected mode. During a read operation, data from the accessed spare memory cell 571 can be transferred to one of the plurality of data outputs 550. During a write operation, data from one of the plurality of data inputs 540 can be transferred into the accessed spare memory cell 571. During the unselected mode, the spare address input 520 can remain inactive while the plurality of regular address inputs 510 remains active.

Also, the spare group of memory cells 570 can include various configurations of spare columns and spare address inputs. For example, the spare group 570 can include first through seventh spare columns, and the spare address input can include first through third spare address inputs. Or, the spare group can include first through third spare columns, and the spare address input can include a first and second spare address input. Other variations, modifications, and alternatives to these configurations can be used.

The memory integrated circuit device 500 can also include an encoded command and address bus 591 having a shared command signal and an address signal, an internal data input reference voltage circuit 592, a command and address parity checking circuit 593 a set of circuits designed to support connectivity testing 594, a reset input signal 595, a set of multi-purpose status registers 596 configured to be read out, or the like and combinations thereof. These modules and circuits can be coupled to a host controller 590. Those of ordinary skill in the art will recognize other variations, modifications, and alternatives.

Many benefits are achieved by way of the present invention over conventional embodiments and techniques. For example, embodiments of a memory IC device can have improved performance and lifetime. Embodiments of a memory interface device can facilitate the "repair" of bad or faulty memory cells, or even undesirable memory cells due to aging, deterioration, or the like. Spare memory cells from a memory IC device can be rerouted via a memory interface device upon detection of predetermined characteristics of memory cell to be replaced. These implementations provide several means of maintaining or improving memory performance, which can be tailored depending on various hardware and/or software requirements of specific applications.

In an example, the present invention provides a method for operating a memory interface device, as outlined below.

1. Receive, at an address input(s) of a memory interface device, address information from an address stream of a host computer; (step 610)
2. Process the address stream from an address command bus coupled to the host controller during a run time operation; (step 620)
3. Compare successively each address from the address stream from information in an address match table to determine to whether an address matches with a stored address in an address match table; (step 630)
4. Identify a bad address provided in the address match table; (step 640)
5. Replace the bad address with a revised address of a spare memory location; (step 650)
6. Transfer the revised address to a multiplexer coupled to the address output; (step 660)
7. Drive address information from an address output(s) of the memory interface device to a plurality of memory devices; (step 670) and
8. Perform other steps, as desired. (step 680)

As shown, the present method has a sequence of steps, which can be varied, modified, replaced, reordered, expanded, contracted, or any combinations thereof. That is, the method repeats any of the above steps. Such steps may be performed alone or in combination with others, which are described or not even described. The steps can be performed in the order shown or in other orders, if desired. The steps also can be performed using a combination of hardware and software using other process steps. The steps also can be performed using hardware or other processes implemented using software and the like. Of course, there can be many other variations, modifications, and alternatives. Further details of the present method can be found throughout the present specification and more particularly below.

Figure 6:
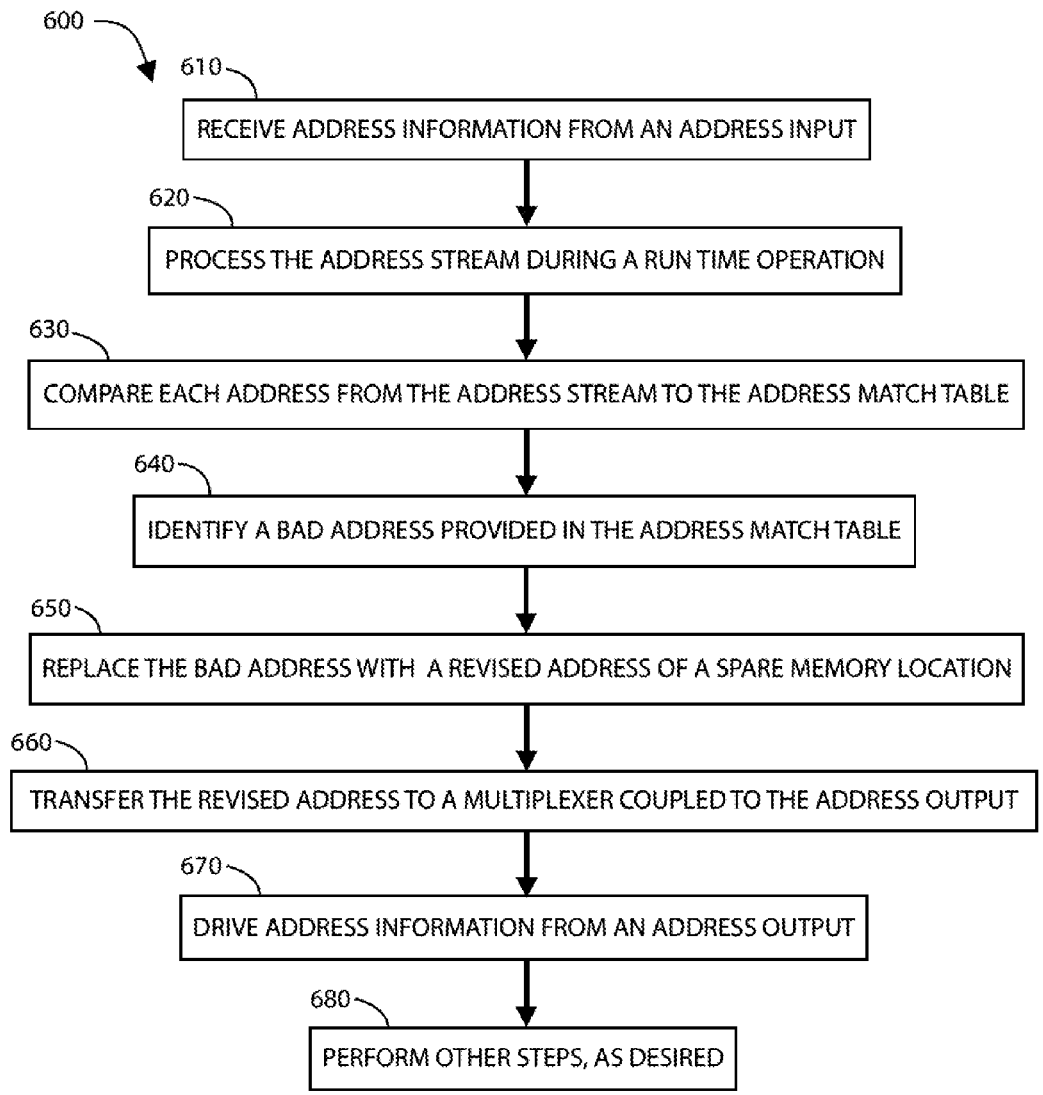
FIG. 6 illustrates a simplified flow diagram for operating the Address Match Table according to an embodiment of the present invention.

FIG. 6 illustrates a simplified flow diagram for operating an address match process for replacing a bad cell with a spare cell according to an embodiment of the present invention. As shown, method 600 can begin with receiving, at address input or inputs of a memory interface device, address information from an address stream of a host computer, step 610. This memory interface device can be coupled to a host computer. The memory interface device can be selected from a register device, a buffer device, an advanced memory buffer, or a buffer on-board. These memory devices can include a plurality of DRAM devices, Flash devices, or other like devices and combinations thereof.

During a run time operation, the address stream from an address command bus coupled to the host controller can be processed, step 620. Each address from the address stream can be compared successively to determine whether an address matches with a stored address in an address match table, step 630. The address table can include a plurality of SRAM cells and can include a plurality of bad address information and a plurality of spare memory locations. Each of these bad address locations can be associated with one of the spare memory locations. Each of the bad address information can include a rank ID, a bank ID, a chip ID, a row address, and a column address. Each of the spare memory locations can include one or more memory groups, which can include columns, rows, or banks, and the like. In a specific embodiment, each of the spare memory locations can include a first, second, and an nth column.

A bad address in the address match table can be identified, step 640, and can be replaced with a revised address of a spare memory location, step 650. The revised address can be transferred to a multiplexer coupled to the address output, step 660. The address match table can be configured to receive bad address information and transfer the spare memory location to replace the bad address associated with the bad address information. Also, method 600 can include driving address information from an address output or outputs of the memory interface device to a plurality of memory devices, step 670.

In a specific embodiment, the comparing, identifying, and replacing can be under control of a control module. This control module can be integrated with the address match table and can further include an input receiver module, a control and status register module, an input command module, and input address module, and an input chip-select decoder module, and other like modules. Further details regarding components of these devices and process are described previously for FIGS. 1-5. Furthermore, other steps can be performed as desired according to various specifications and applications, step 680.

In an embodiment, the present invention provides architecture for storing and retrieving a fixed list of content entries in a space, power, and performance efficient manner. This fixed list can have a size ranging anywhere from thousands of content entries to an upper limit determined by the practicality of software and/or hardware implementations. The content entries of these lists, which can include a tuple (key, value), are of fixed or variable length binary digit strings. The size of these content entries is in hundreds of bits and the upper limit is also determined by the implementation constraints. Those of ordinary skill in the art will recognize other variations, modifications, and alternatives.

In silicon hardware, Content Addressable Memory (CAM) architectures are used to efficiently store and retrieve content entries. CAMs are used in microprocessors for fast address translations lookup and in network routing processors for Internet Protocol (IP) address search engines. However, if the number of content entries to be stored for matching is in the tens of thousands, then CAMs become impractical and expensive, both in terms of silicon area and power.

In microprocessors, set associative caches are used for this large number of content entries. Set-associative caches are very efficient in dynamically storing and retrieving program instructions or data. In other words, computer programs reference billions of instructions/data during run time and the set associative caches temporarily cache these references. Generally, the set associative caches have tens of thousands of locations for content storage. The effectiveness of set associative caches stems from the following fact: during small temporal bursts of instruction or data references include only a few thousand references that have spatial or temporal locality.

In some applications, the number of content entries is fixed and arbitrary with no spatial or temporal locality. In this case, the set associative caches will be inefficient. In other words, the amount of storage required to store may far exceed the actual storage required for the number of content entries. This is because more sets are allocated to resolve conflict misses. Simulations have indicated that there is about 25% efficiency in set-associative caches for randomly generated fixed-size content entry lists.

One of the program areas in a set-associative cache is that the ways are all associated with a set-index generated by a single hash function. In the present invention, the ways from one set-index to multiple set indexes can be decoupled. Multiple set indexes can be generated by different hash functions. For cases where the sets and ways cannot accommodate content entries, another structure based on a coalesced-chain index can be used. This combination of multiple hash functions, set-associativity, and coalesced chain indexing can accomplish greater than 96% efficiency for content entry sizes up to hundreds of thousands with lookup efficiency in less than tens of cycles.

Figure 7:
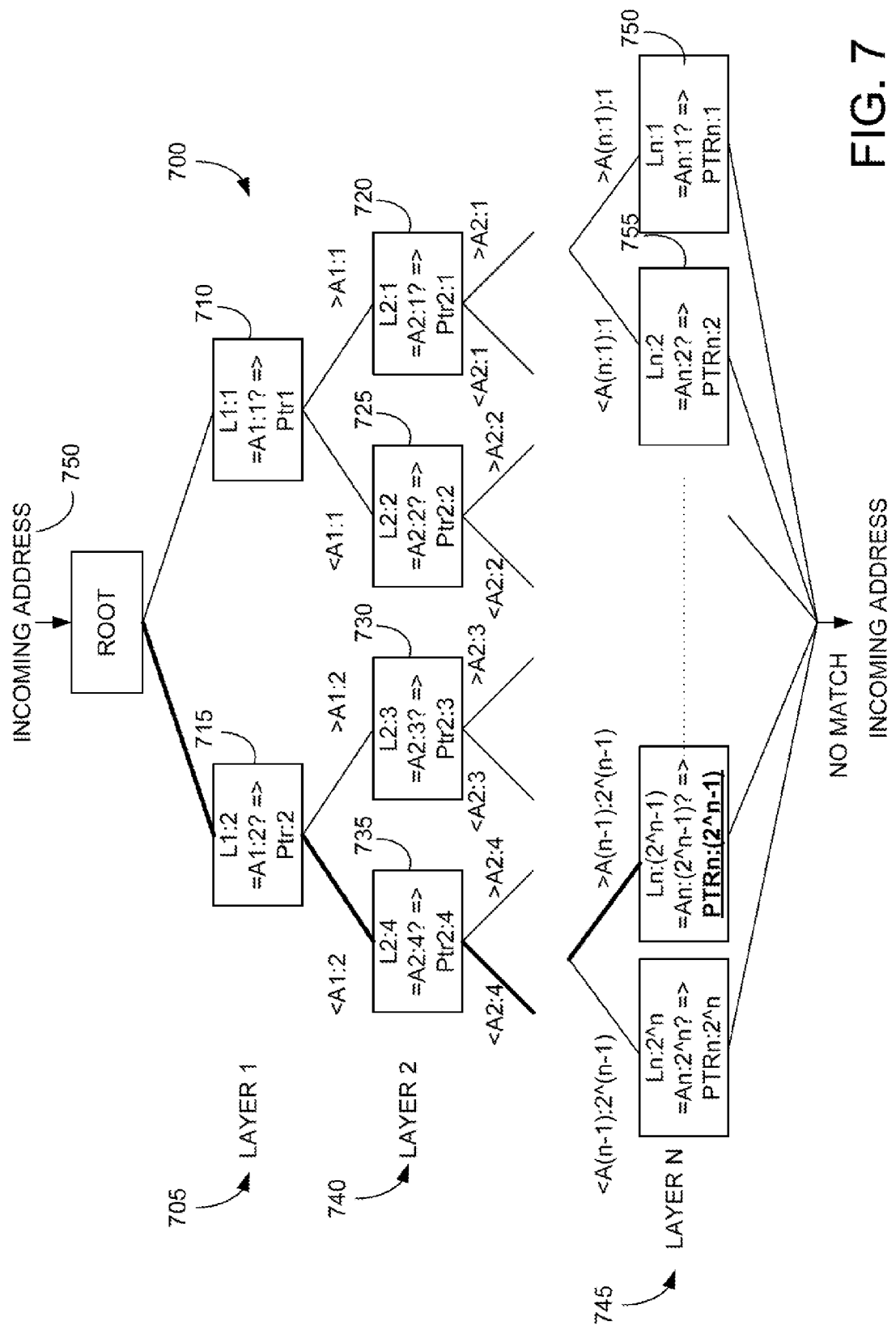
FIG. 7 illustrates a logical structure according to various embodiments of the present invention.

FIG. 7 illustrates a logical structure according to various embodiments of the present invention. More specifically, FIG. 7 illustrates an example of a (sorted) binary search tree 700. In this embodiment, n represents the layer number of binary tree 700. For example, within layer 1, 705, two nodes L1:1 and L1:2, 710 and 715 are illustrated, wherein node L1:1 710 is associated with a first comparison value (key), address A1:1, and node L1:2 (715) is associated with a second key, address A1:2. In various embodiments, the addresses represent address of cells that are determined to be bad within a memory, i.e. a bad cell.

In this example, when incoming address matches address A1:1, a pointer to a replacement address Ptr1, is returned as a match from binary search tree 700; when incoming address matches address A1:2, a pointer to a replacement address Ptr2, is returned as a match from binary search tree 700.

As illustrated in FIG. 7, node L1:1 has two child nodes (pointers to nodes) L2:1 (720) and L2:2 (725); and node L1:2 has two child nodes L2:3 (730) and L2:4 (735). In this structure, if incoming address 750 to node L1:1 (710) has a value greater to A1:1, the search proceeds to node L2:1 (720); and if incoming address 750 has a value less than A1:1, the search proceeds to ode L2:2 (725). Similarly if incoming address 750 to node L1:2 (715) has a value greater to A1:2, the search proceeds to node L2:3 (730); and if incoming address 750 has a value less than A1:2, the search proceeds to node L2:4 (735).

Accordingly, in layer 1 (705), one of two comparisons are performed ($2^1=2$); at layer 2 (740), one of four comparisons are performed ($2^2=4$); at layer 3, one of eight comparisons ($2^3=8$) are performed; at layer 4, one of sixteen comparisons are performed ($2^4=16$); at layer 5, one of thirty two comparisons are performed ($2^5=32$); and the like. As can be understood, traversing binary search tree 700 having "n" levels (up to 2n elements), a search on an incoming address may require up to "n" comparisons to determine whether it is an address of a bad cell, or not.

Figure 8:
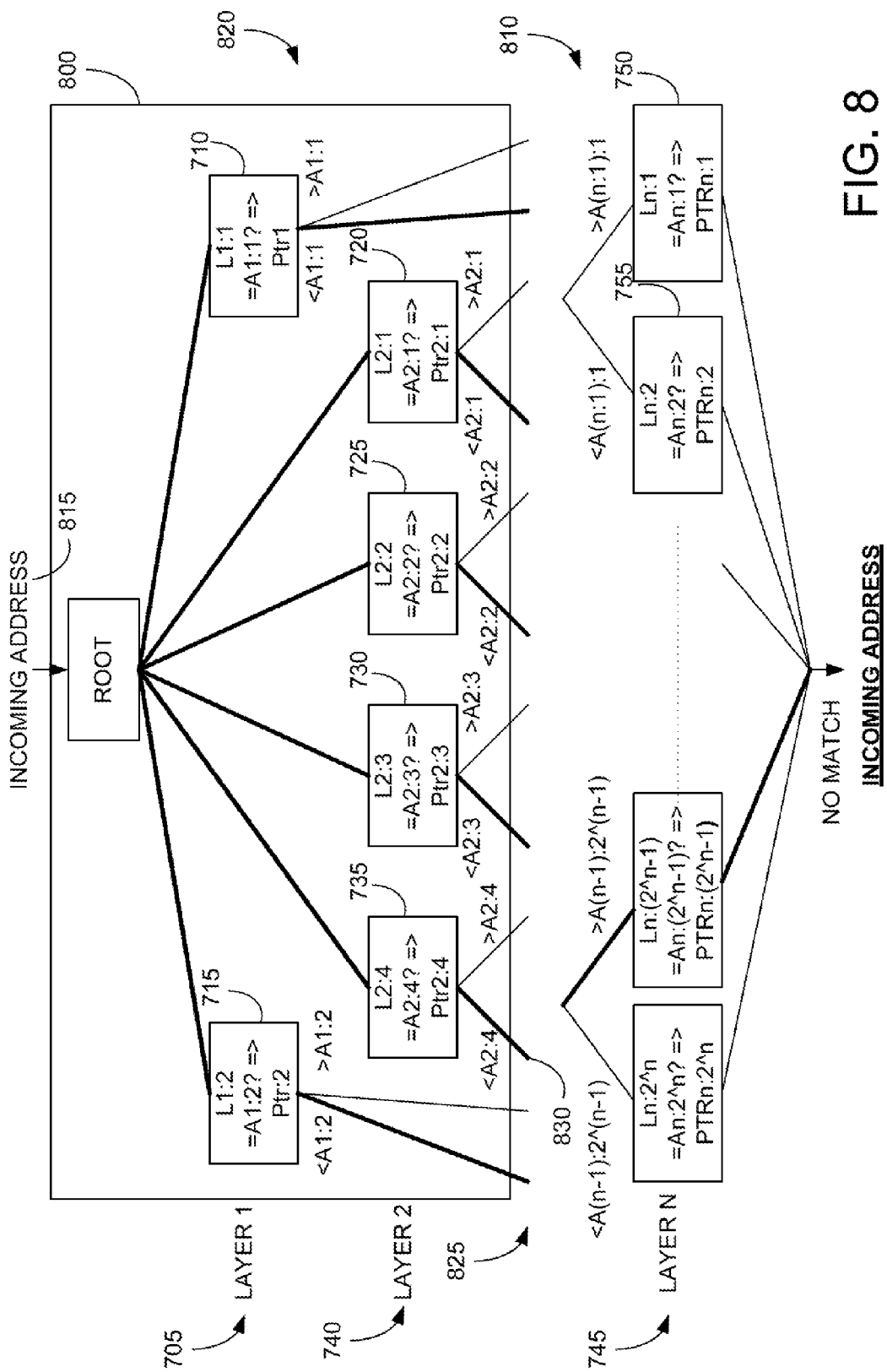
FIG. 8 illustrates a logical structure according various embodiments of the present invention.

FIG. 8 illustrates a logical structure according to various embodiments of the present invention. More specifically, FIG. 8 illustrates an example of a modified binary search tree structure 820 according to various embodiments of the present invention. In various embodiments, a parallel comparison structure 800 and a truncated binary search tree 810 are shown, with reference numerals corresponding to FIG. 7.

In various embodiments, a parallel comparison structure 800 is provided that enables comparisons within more than one layer of a binary search tree to be performed in parallel. In the example in FIG. 8 nodes 710, 715, 720, 725, 730, and 735 in layers 705 and 740 receive incoming address 815 in parallel, and each node 710-735 compares incoming address 815 to A1:1, A1:2, A2:1, A2:2, A2:3 and A2:4, respectively, in parallel. In various embodiments, if incoming address 815 matches one of A1:1 to A2:4, the result of the binary search will be one of A1:1 to A2:4.

As illustrated in bold, in one example, based upon the comparisons of incoming address 815 against A1:1-A2:4, parallel comparison results 825 are output from parallel comparison structure 800. In various embodiments, based upon parallel comparison results 825, one child node 830 is selected as entry to truncated binary search tree 810. In this example, although A1:1-A2:4 are performed in parallel, the comparisons A1:1 and A1:2 are used to decide whether the result of A2:1 or A2:2 are used.

In the example in FIG. 7, N comparisons are performed to determine, for example that the address for a bad cell specified by incoming address 750 is PTRn:($2^n-1$). In contrast, in the example in FIG. 8, N–1 comparisons are performed to determine that the incoming address 815 is not an address of a bad memory cell. As can be seen, by compressing the first M rows of a binary search tree, and performing these comparisons in one search cycle, a worse case search time is decreased by M–1 cycles.

As another simple example, there are 4,000 bad cell/replacement cell addresses or fewer in an address match table. In various embodiments, the bad cell address are first ordered in a balanced binary search tree of depth N=11. Accordingly, a straightforward search of this binary search tree comparisons of the first M layers, for example, may take up to M comparison cycles, and it may take up to 11 comparison cycles to determine whether an incoming address is a bad cell address.

Continuing the example above, in various embodiments of the present invention, the comparisons specified by the first M (e.g. 5) layers of the binary search tree are placed into a parallel comparison structure. In this example where M=5, there may be up to 63 searches (32+16+8+4+2+1=63). In various embodiments, these 63 searches are performed substantially in parallel, in a single search cycle. Further, for remaining layers 6 to 11 in a binary search tree, up to six (6) additional comparison cycles are performed. Accordingly, with a parallel comparison structure and truncated binary search tree, it may take up to 7 comparison cycles (1 parallel+6 serial) to determine whether an incoming address is a bad cell address. As can be determined, this represents about a 37% decrease in amount of comparison time (11 to 7=37%).

In some embodiments, in addition to the above, the least significant bit (odd/even) may also be used to quickly determine whether or not an incoming address matches a particular node.

In other embodiments, the layer selected from the binary search tree for parallel comparison may be different, for example, the layer may be the third, fourth, sixth, or the like. As the number of layers M of a binary search tree used in a parallel comparison structure increases, the number of comparison cycles decreases, however the amount of comparison hardware increases.

As shown, the present method has a sequence of steps, which can be varied, modified, replaced, reordered, expanded, contracted, or any combinations thereof. That is, the method repeats any of the above steps. Such steps may be performed alone or in combination with others, which are described or not even described. The steps can be performed in the order shown or in other orders, if desired. The steps also can be performed using a combination of hardware and software using other process steps. The steps also can be performed using hardware or other processes implemented using software and the like. Of course, there can be many other variations, modifications, and alternatives.

Various example embodiments as described with reference to the accompanying drawings, in which embodiments have been shown. This inventive concept may, however, be embodied in many different forms and should not be construed as limited to the embodiments set forth herein. Rather, these embodiments are provided so that this disclosure is thorough and complete, and has fully conveyed the scope of the inventive concept to those skilled in the art. Like reference numerals refer to like elements throughout this application.

It has been understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the inventive concept. As used herein, the term "and/or" includes any and all combinations of one or more of the associated listed items.

It has be understood that when an element is referred to as being "connected" or "coupled" to another element, it can be directly connected or coupled to the other element or intervening elements may be present. In contrast, when an element is referred to as being "directly connected" or "directly coupled" to another element, there may be no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which this inventive concept belongs. It has been be further understood that terms, such as those defined in commonly used dictionaries, should be interpreted as having a meaning that is consistent with their meaning in the context of the relevant art and will not be interpreted in an idealized or overly formal sense unless expressly so defined herein.

It should be understood that the description recited above is an example of the disclosure and that modifications and changes to the examples may be undertaken which are within the scope of the claimed disclosure. Therefore, the scope of the appended claims should be accorded the broadest interpretation so as to encompass all such modifications and similar arrangements, including a full scope of equivalents.

I claim:

1. A memory interface for a plurality of DRAM devices comprising an input DRAM address matching module comprising:
   a local memory comprising a plurality of data entries, wherein the plurality of data entries comprising a plurality of DRAM addresses and a plurality of associated pointers, and wherein the plurality of associated pointers comprise output DRAM addresses; and
   a matching mechanism coupled to the local memory, wherein the matching mechanism is configured to receive the input DRAM address, wherein the matching mechanism is configured to determine whether the input DRAM address is specified in the plurality of data entries, and when the input DRAM address is specified in the plurality of data entries, the matching mechanism is configured to output an associated pointer associated with the input DRAM address, wherein the matching mechanism further comprises,
   a first portion configured to receive the plurality of data entries from the local memory, wherein the plurality of data entries are logically ordered within a binary search tree comprising N layers, wherein each node of the binary search tree is associated with a data entry from the plurality of data entries, wherein nodes in an upper M layers of the binary search tree are associated with a first subset of the plurality of data entries, and wherein nodes in lower N-M layers of the binary search tree are associated with a second subset of the plurality of data entries, and
   a second portion coupled to the first portion, wherein the second portion is configured to receive the input DRAM address, and wherein the second portion is configured to perform comparisons of the input DRAM address to the first subset of the plurality of data entries in parallel, wherein the second portion comprises a plurality of comparators;
   wherein N>M,
   wherein M is selected based upon a number of the comparators, and
   wherein the second subset of the plurality of data entries are logically ordered within a truncated binary search tree comprising N-M layers.

2. The memory interface of claim 1 wherein the second portion is configured to output a pointer associated with the input DRAM address.

3. The memory interface of claim 1 wherein the first portion is configured to perform comparisons of the input DRAM address to less than all data entries from the second subset of the plurality of data entries.

4. The memory interface of claim 3
   wherein the second portion is configured to perform the comparisons in a single comparison cycle; and
   wherein the first portion is configured to perform the comparisons in N-M comparison cycles.

5. The memory interface of claim 1 wherein M is selected from a group consisting of: 2, 3, 4, 5 and 6.

6. A memory interface for a plurality of DRAM devices comprising:
   a memory configured to store a plurality of data entries comprising a plurality of bad DRAM addresses and an associated plurality of replacement DRAM addresses;
   an address matching mechanism coupled to the memory, wherein the address matching mechanism is configured to receive the plurality of data entries, wherein the address matching mechanism is configured to organize the plurality of data entries into a binary search tree, wherein the address matching mechanism is configured to determine whether an incoming DRAM address matches one of the plurality of bad DRAM address, wherein the address matching mechanism is configured to output an associated replacement DRAM address in response to the incoming DRAM address when the incoming DDRAM address matches one of the plurality of bad DRAM address, and wherein the address matching mechanism is configured to output the incoming DRAM address when the incoming DDRAM address does not match one of the plurality of bad DRAM addresses;
   wherein the binary search tree comprises N layers;
   wherein the address matching mechanism comprises a plurality of comparators configured to determine whether the incoming DRAM address matches bad DRAM addresses of a first plurality of the data entries that are associated with a first M layers of the binary search tree, in a parallel comparison cycle; and
   wherein M>2 and M<N, and M is selected based upon a number of the comparators;
   wherein layers M+1 through N of the binary search tree form a truncated binary search tree; and
   wherein the address matching mechanism is configured to determine an entry node for the truncated binary search tree in response to the determination whether the incoming DRAM address matches bad DRAM addresses of the first plurality of data entries, wherein the entry node is determined from a least significant bit of the incoming DRAM address.

7. The memory interface of claim 6 wherein the address matching mechanism is configured to determine whether the incoming DRAM address matches bad DRAM addresses of a second plurality of the data entries that are associated with layers M+1 through N of the binary search tree, in N-M or fewer comparison cycles.

8. The memory interface of claim 6 wherein N is selected from a group consisting of: 10, 11, 12, 13.

9. The memory interface of claim 8 wherein M is selected from a group consisting of: 3, 4, 5, 6.

10. A method for determining an output DRAM address in response to an input DRAM address comprises:
    receiving in a matching mechanism comprising a plurality of comparators, a plurality of data entries comprising a plurality of bad DRAM addresses and an associated plurality of replacement DRAM addresses;
    determining in the matching mechanism, a binary search tree from the plurality of data entries comprising N layers;
    determining in the matching mechanism, a first plurality of data entries from the plurality of data entries in a first M layers of a truncated binary search tree, M selected based upon a number of the comparators;

comparing in the matching mechanism, an incoming DRAM address to the first plurality of data entries in a single parallel comparison cycle;

outputting from the matching mechanism, a replacement DRAM address when the incoming DRAM address matches a DRAM address within the first plurality of data entries, wherein the replacement DRAM address is associated with the DRAM address.

11. The method of claim 10 further comprising:

determining in the matching mechanism, an entry point into the binary search tree when the incoming DRAM address does not match any DRAM addresses within the first plurality of data entries, wherein the entry point is determined from a least significant bit of the incoming DRAM address.

12. The method of claim 11 wherein a second plurality of data entries from the plurality of data entries are in layers M+1 to layer N of the binary search tree; and wherein the method further comprising using in the matching mechanism, the binary search tree to determine whether the incoming DRAM address matches another DRAM address within the second plurality of data entries.

13. The method of claim 12 further comprising outputting from the matching mechanism, another replacement DRAM address when the incoming DRAM address matches another DRAM address within the second plurality of data entries, wherein the other replacement DRAM address is associated with the other DRAM address.

14. The method of claim 12 wherein using in the matching mechanism, to determine whether the incoming DRAM address matches another DRAM address within the second plurality of data entries occurs from one to N-M comparison cycles.

* * * * *